Sept. 21, 1965 V. E. VAN DUZER 3,208,006

VARIABLE FREQUENCY SIGNAL GENERATORS

Filed Nov. 13, 1961 2 Sheets-Sheet 1

INVENTOR
VICTOR E. VAN DUZER

BY [signature]

ATTORNEY

Sept. 21, 1965 V. E. VAN DUZER 3,208,006

VARIABLE FREQUENCY SIGNAL GENERATORS

Filed Nov. 13, 1961 2 Sheets-Sheet 2

INVENTOR
VICTOR E. VAN DUZER
BY [signature]
ATTORNEY

United States Patent Office 3,208,006
Patented Sept. 21, 1965

1 2

3,208,006
VARIABLE FREQUENCY SIGNAL GENERATORS
Victor E. Van Duzer, Mountain View, Calif., assignor to Hewlett-Packard Company, Palo Alto, Calif., a corporation of California
Filed Nov. 13, 1961, Ser. No. 151,837
14 Claims. (Cl. 331—38)

Figure 1:
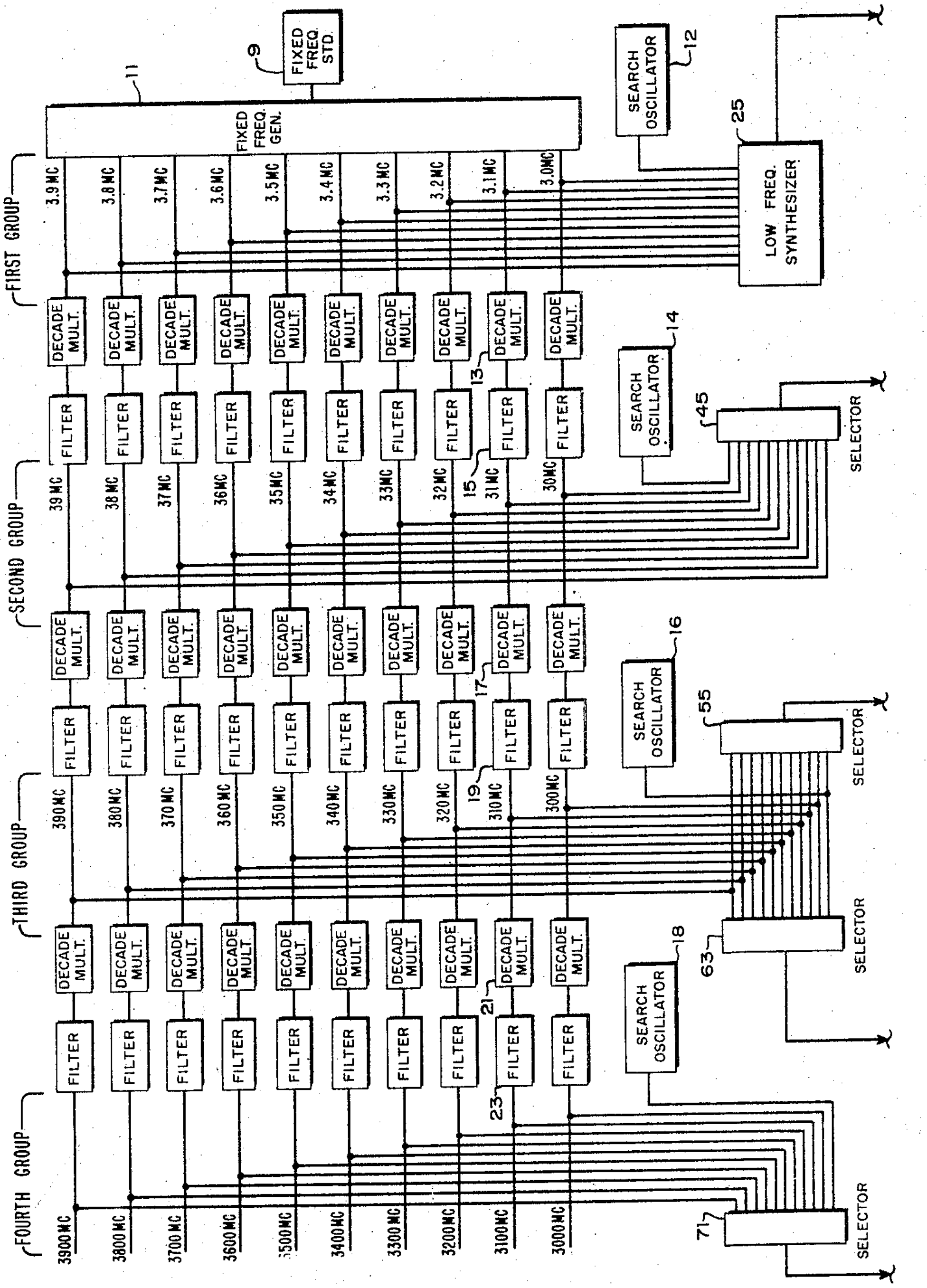

This invention relates to variable frequency signal generators and more particularly to a signal frequency synthesizing device which produces an output signal, the significant digits of which are independently controllable.

A frequency synthesizer is basically a digital device which produces an output signal having the frequency stability of a fixed frequency standard. The frequency of the output signal may be varied in discrete steps by varying the manner in which a number of fixed frequencies are combined. Although the basic principle of a frequency synthesizer is relatively simple, many problems are encountered in the design and construction of a useful and practical device. For example, the extent of the freedom from distortion and from unwanted modulation products in the output signal is determined primarily by the filters used in the system. However, the logical design of the circuits and the selection of the values of the frequencies to be derived from the standard establish the requirements for the system filters to a large extent. Where filter requirements are not stringent, i.e., where the desired signal frequencies are far removed from frequencies of unwanted modulation products, good filter design is possible and substantially distortion-free output signals may be produced. Thus, highly effective filtering is readily attainable when the filtering requirements are such that undesirable harmonics of applied signals and dominant modulation products are outside the pass band of a given filter in the system. These unwanted modulation products or side bands in the output signal are typically required to be within one-hundredth of one percent of the output signal level. One system for reducing the filtering requirements is suggested in U.S. Patent 2,973,483, issued on February 28, 1961, to R. R. Stone, Jr.

The logical design of the system also determines the actual size and the type of physical elements required. For example, the logical design of one known synthesizer requires the use of machanical turret switches to select ranges of significant digits of the output signal frequency. These switches comprise large numbers of filters and components which are combined to provide output signal frequencies over pre-determined ranges of values. Mechanical switches of this type are cumbersome and expensive and are highly suseptible to mechanical failure. Thus, it is highly desirable in a synthesizer to use a logical design using a minimum number of filters, which filters are used for all ranges of values of output signal frequency. Moreover, it is desirable to use a logical design which permits the use of inexpensive, reliable and fast-acting switches to select the fixed frequencies required to produce the desired significant digits of the output signal frequency.

It is an object of the present invention to provide a frequency synthesizer which, starting from a small number of fixed frequencies, produces an output signal having a frequency, the significant digits of which are independently variable.

It is another object of the present invention to provide a frequency synthesizer which uses a small number of filters for operation over the entire range of output frequencies and which uses inexpensive and reliable switches to change rapidly the significant digits of the output signal frequency.

In accordance with the illustrated embodiment of the present invention, a number of selected fixed frequencies are combined in a preselected order to produce an output signal of known frequency. There are four groups of fixed frequencies. The first group comprises ten fixed frequencies ranging from 3.0 to 3.9 megacycles, in nine equal steps. The second, third and fourth groups comprise fixed frequencies which are multiples of ten of the frequencies of the preceding groups. This range of values permits the use of filters which operate to reject most unwanted modulation products or side bands. These unwanted signals are thus easy to filter out of the output signal. In addition, a scheme is provided which uses a small number of filters and which obviates the need for switching the filters when the output signal frequency is varied beyond a given range of values. Moreover, fast frequency selection is obtained by using diode switches controlled by applied control signals.

Figure 2:
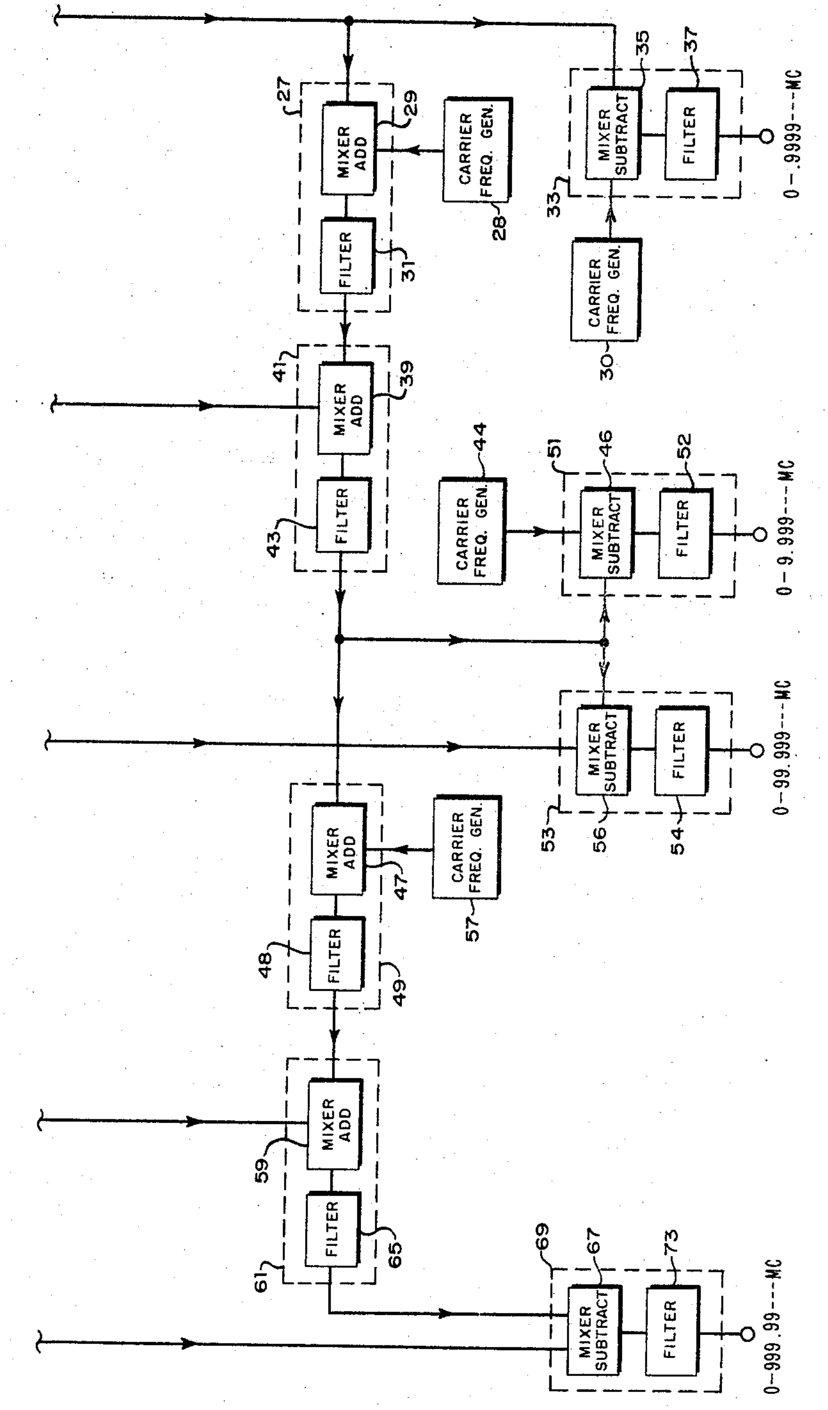

Other and incidental objects of the present invention will be apparent from a reading of this specification and an inspection of the accompanying drawing in which FIGURES 1 and 2 show a schematic diagram of the synthesizer according to the present invention.

Referring now to FIGURES 1 and 2, there is shown a fixed frequency standard 9 connected to the fixed-frequency generator 11. The first group of fixed frequencies ranging from 3 megacycles to 3.9 megacycles is produced by the fixed-frequency generator 11. Each of the fixed frequencies produced by the fixed-frequency generator 11 passes through successive stages of frequency multiplication and filtering to provide successive groups of fixed frequencies. Thus a given fixed frequency in the first group, say 3.1 megacycles, when multiplied by decade multiplier 13 and filtered by filter 15 provides a signal having a frequency of 31 megacycles. The 31 megacycle signal is again multiplied by decade multiplier 17 and filtered by filter 19 to produce a signal having a frequency of 310 megacycles. The 310 megacycle signal is again multiplied by decade multiplier 21 and filtered by filter 23 to produce a signal having a frequency of 3100 megacycles. For convenience, the fixed frequencies having similar orders of magnitude are designated as being in one of the first to fourth groups of fixed frequencies. Each of carrier frequency generators 28, 30, 44 and 57 produce signals having frequencies which are derived from and which are harmonically related to the output frequency of the fixed frequency standard 9.

It should be noted that the previously described groups of fixed frequencies may also be produced by first generating a group of fixed frequencies ranging from 30 to 39 megacycles. The groups of fixed frequencies of higher orders of magnitude may thus be produced in the manner previously described. Groups of lower fixed frequencies may thus be produced by dividing down and filtering each of the fixed frequencies produced by the fixed-frequency generator.

Also, it should be noted that an eleventh frequency may be provided in each of the groups, which frequency may be varied over the range of values covered by the fixed frequencies. For example, a voltage-controlled oscillator operating over the range from 30 to 39 megacycles may provide the eleventh frequency in the second group. The use of search oscillators 12, 14, 16 and 18 in each of the groups of frequencies thus permits a selected digit or digits of the output frequency to be varied continuously. This provides a continuous sweep through a range of frequencies between accurate, preselected end points. Also, this provides means for determining the frequency of a rapidly changing unknown frequency by making frequency comparative or beat frequency measurements.

Low-frequency synthesizer 25 is connected to receive the frequencies of the first group, which frequencies range from 3 to 3.9 megacycles. The signal from the low-frequency synthesizer 25 is applied to a first signal stage comprising mixer-adder 29 and filter 31. This signal may also be applied to a difference network 33 comprising mixer-subtracter 35 and filter 37 when an output frequency ranging from zero substantially to one megacycle is desired. A carrier frequency generator 28 is connected to the other input of mixer-adder 29 of the first stage 27. A carrier frequency generator 30 is connected to the other input of mixer-subtractor 35 of the difference network 33. The output of the first signal stage 27 is applied to an input of mixer-adder 39 of the second signal stage 41 which also comprises filter 43. The other input of mixer-adder 39 is connected through selector 45 to any selected one of the fixed frequencies of the second group. The output of signal stage 41 is applied to an input of mixer-adder 47 of signal stage 49 and may also be applied to inputs of difference networks 51 and 53. The other input of difference network 51 is connected to carrier frequency generator 50. The other input of difference network 53 may be connected through selector 55 to any one of the fixed frequencies in the third group. Difference networks 51 and 53 also comprise filters 52 and 54, respectively. The other input of mixer-adder 47 of signal stage 49 is connected to the carrier frequency generator 57. The output of signal stage 49 is applied to one input of mixer-adder 59 of signal stage 61. The other input of mixer-adder 59 is connected through selector 63 to receive a selected one of the fixed frequencies in the third group. The output of signal stage 61 which comprises filter 65 is applied to an input of mixer-subtractor 67 of the difference network 69. The other input of mixer-subtractor 67 is connected through selector 71 to receive a selected one of the fixed frequencies in the fourth group.

In operation, the low-frequency synthesizer 25 operates on the first group of frequencies to provide a signal ranging from 30 to 31 megacycles and having a predetermined number of significant digits in the frequency thereof. This low-frequency synthesizer thus serves as a source of variable frequency signal. Other signal generating means may be used in place of the low-frequency synthesizer where the frequency of the signal from such generating means must be increased by the addition of two or three most significant digits.

An output signal in more useful form may be produced by subtracting from the frequency of the signal produced by low-frequency synthesizer 25 the frequency (30 megacycles) of the signal produced by carrier frequency generator 30. The resultant frequency thus produced by mixer-subtractor 35 of difference network 33 and ranging from zero substantially to one megacycle is applied to filter 37. High effective rejection of unwanted signals is readily obtained using a minimum number of filter elements since the highest frequency in the operating range of the filter is much less than one tenth the frequency of the lowest frequency signal applied to the difference network. The signal produced by low-frequency synthesizer 25, ranging in frequency from 30 to 31 megacycles, or the signal from other variable frequency means, is applied to the first signal stage 27 wherein it is mixed with the signal produced by the carrier frequency generator 28. A typical value for the frequency of the signal produced by carrier frequency generator 28 is 330 megacycles. Thus, the resultant frequency applied to filter 31 of the first signal stage 27 ranges in frequency from 360 to 361 megacycles. High effective rejection of unwanted signal frequencies is possible since this operating range is much higher than even the tenth harmonic of the signal produced by the low-frequency synthesizer 25. Also, the fundamental frequency of carrier frequency generator 28 is sufficiently far removed from the pass band of filter 31 to be easily filtered out thereby.

The output signal of the first signal stage 27 is applied to the second signal stage 41 wherein it is mixed with a pre-selected one of the second group of frequencies. Signal frequencies from the first signal stage and ranging from 360 to 361 megacycles are thus mixed with signal frequencies ranging from 30 to 39 megacycles. The frequency of the resultant signal applied to filter 43 of the second signal stage thus ranges from 390 to 400 megacycles. The filter 43 provides high rejection of unwanted signals since this range of frequencies is substantially greater than at least the tenth harmonic of the frequencies in the second group of frequencies and is sufficiently far removed from the fundamental of frequencies produced by the first signal stage.

The output signal of the second signal stage 41 is applied to mixer-adder 47 of the third signal stage 49. This signal frequency is mixed with the signal frequency received from the carrier frequency generator 57 which has a frequency of 3210 megacycles. The resulting frequency thus applied to filter 48 ranges from 3600 to 3610 megacycles. High effective rejection of unwanted signals is easily obtained from filter 48 since the range of frequencies over which it operates is much greater than at least the ninth harmonic of the signal frequencies applied from the second signal stage 41 and is sufficiently far removed from the frequency of the carrier frequency generator.

The output signal of the third signal stage 49 is applied to mixer-adder 59 of signal stage 61. This signal is mixed with a selected one of the frequencies in the third group to provide a resultant signal having frequency which ranges between 3900 and 4000 megacycles, which signal frequency is applied to filter 65. High effective rejection of unwanted signals is easily obtained since the range of frequencies over which filter 65 operates is sufficiently far removed from the frequencies of the signal received from the third signal stage and is greater than at least the ninth harmonic of the frequencies in the third group.

An output signal having three additional significant figures more than the output signal derived from the signal produced by low-frequency synthesizer 25 and ranging in frequency from zero substantially to one kilomegacycle may be obtained from the signal produced by the fourth signal stage 61. This is achieved by subtracting from the frequency of the signal of the fourth stage the frequency of the selected one of the frequencies in the fourth group. The maximum output frequency is thus obtained when the frequency of the fourth stage signal is substantially 4000 megacycles and the frequency selected from the fourth group to be subtracted therefrom is 3000 megacycles. High effective rejection of unwanted signals is easily attainable using a small number of filter elements in filter 73 since the maximum frequency in the operating range is less than one third the minimum frequency of signals applied to difference network 69.

An output signal having two significant digits more than the output signal of low-frequency synthesizer 25 and ranging from zero substantially to 100 megacycles may be obtained by subtracting from the frequency of the second stage output signal a selected one of the frequencies in the third group. The maximum frequency is obtained when the frequency of the second stage output signal is substantially 400 megacycles and the frequency of the third group selected to be subtracted therefrom is 300 megacycles. High effective filtering of the output signal from mixer-subtractor 56 is provided by filter 54 which operates over a range from zero substantially to 100 megacycles. This range of frequencies is sufficiently far removed from the frequencies in the third group and from the frequency of the output signal from the second signal stage to permit high rejection of unwanted signals using a small number of filter elements.

An output signal having one significant digit more than the output signal of low-frequency synthesizer 25 and ranging from zero substantially to ten megacycles may be obtained by subtracting from the frequency of the signal from the second stage a frequency of 390 megacycles produced by carrier frequency generator 44. Thus the maximum output frequency of substantially ten megacycles is obtained when the frequency of the signal from the second signal stage is substantially 400 megacycles. High rejection of unwanted signals is easily obtained from filter 52 operating over the range from zero substantially to ten megacycles since the frequency range is less than one tenth of the frequencies of signals applied to mixer-subtracter 46.

Therefore, the frequency synthesizer of the present invention is designed to use a small number of filters, each designed to operate over a limited range of frequencies and and each being permanently connected in the circuit. High rejection of unwanted modulation products and spurious frequencies are readily obtained using a small number of filter elements since each of the filters operates over a limited range which is far removed from the values of the frequencies to be mixed. Also since the filters are permanently connected in the circuit, turret-type mechanical switches carrying complex combinations of filter elements are thus avoided. Moreover, the synthesizer of the present invention uses reliable selectors for adjusting the significant digits of the frequency of the output signal. The use of diode switches or other such fast-acting switches as selectors is made possible with the logical design used in the synthesizer of the present invention. The logical design, in addition to using a small number of filters permanently connected in the system, uses groups of successively increasing fixed frequencies, each of which frequencies in a preceding group is multiplied by ten and filtered to provide the frequencies of a successive group. Thus, the selectors operatively connect synthesizer circuits and selected ones of the grouped frequencies to provide rapid selection of the significant digits of the frequency of the output signal. In fact, rapid switching of output frequency may be programmed in the present invention in applications requiring coded transmission of information. In addition, by providing sources of variable frequency signal in each of the groups of fixed frequencies and by selecting such signal in a particular group, the frequency of the output signal may be swept continuously over the range between accurately determined end points.

I claim:

1. Signal apparatus comprising means forming a first group of fixed frequencies, means forming a second group of fixed frequencies by multiplying by a selected radix each of the fixed frequencies of the first group, a first source of signal frequency, a second source of signal having a frequency higher than said signal frequency from the first source, means forming a first resultant frequency within the range of fixed frequencies in said second group as the combination of the frequencies of said signals from said first and second sources, means forming a second resultant frequency as the combination of the first resultant frequency and a selected one of the fixed frequencies in the first group, means connected to receive the fixed frequencies in the second group for providing a selected frequency signal, and means forming an output signal as the combination of said selected frequency signal and said second resultant frequency.

2. A frequency synthesizer comprising first and second signal stages and an output stage, each having an output and two inputs and being adapted to combine the frequencies of signals applied to the inputs thereof, means generating a first group of fixed frequencies, means generating successive groups of fixed frequencies related by successive powers of a radix to the fixed frequencies in the first group, a first source of signal connected to receive the frequencies of the first group for producing therefrom a signal of variable frequency, a second source of signal frequency higher than the frequency of the signal from said first source, means connected to the inputs of the first signal stage for applying thereto said signals from the first and second sources to produce a signal at the output of said first signal stage having a frequency within the range of fixed frequencies in a third one of said groups of fixed frequencies, means connecting the output of the first stage and an input of the second stage, means connected to the other input of the second stage for applying thereto a selected one of the fixed frequencies in a second one of said groups of fixed frequencies, means connecting the output of the second stage to an input of said output stage, means connected to the other input of said output stage for applying thereto a selected one of the fixed frequencies in a third one of said groups of fixed frequencies, said output stage producing an output signal having a frequency related to the frequencies of the signals appearing at the inputs thereof.

3. A frequency synthesizer comprising means forming a first group of fixed frequencies, each appearing on a separate conductor, means connected to each of said conductors for multiplying the frequency of signal appearing thereon by a selected radix, the multiplied frequencies forming a second group of fixed frequencies each appearing on a separate conductor, first and second switching means connected respectively to the conductors of said first and second groups, each of said switching means having an output and each being adapted to connect said output to a selected one of the conductors in a respective group, a first source of signal frequency, a second source of signal having a frequency higher than the signal frequency from the first source, first circuit means connected to said sources for producing a first resultant frequency within the range of fixed frequencies in said second group as the combination of the frequencies of the signals from the first and second sources, second circuit means connected to the outputs of the first switching means and first circuit means for producing a second resultant frequency as the combination of the frequencies of signals appearing at the outputs of said first switching means and first circuit means, and means connected to the outputs of the second circuit means and second switching means for producing an output signal having a frequency related to the combination of the frequencies of signals appearing at the outputs of said second switching means and second circuit means.

4. A frequency synthesizer comprising first and second signal stages, each having an output and two inputs and being adapted to add the frequencies of signals applied to the inputs thereof, means generating a first group of fixed frequencies each appearing on a separate conductor, means connected to each of said conductors for multiplying the fixed frequency appearing thereon by ten, the multiplied frequencies forming a second group of fixed frequencies each appearing on a separate conductor, a first source of signal frequency, a second source of signal having a frequency higher than the signal frequency, means connecting the first and second sources to the inputs of the first signal stage for producing a signal at the output thereof having a frequency within the range of fixed frequencies in the second group, means connecting the output of the first signal stage and an input of the second stage, means connected to said conductors in the first group and to the other input of the second stage for applying thereto a selected one of said fixed frequencies in the first group, an output network having a pair of inputs and being adapted to produce an output signal having a frequency related to the difference between the frequencies of signals applied to the inputs thereof, means connecting the output of the second stage and one input of the output network, and means connected to the conductors of the second group and to the other input of the output network for applying thereto a selected one of said fixed frequencies in the second group.

5. A synthesizer as in claim 4 comprising means producing a third group of fixed frequencies each appearing on a separate conductor, the fixed frequencies of the third group being one tenth the fixed frequencies of the first group, said first source of signal frequency being connected to the conductors in the third group and being adapted to produce said signal frequency as the combination of selected ones of said fixed frequencies in the third group.

6. A frequency synthesizer comprising a plurality of signal stages each having at least two inputs and an output and being adapted to produce modulation products as the combination of the frequencies of signals applied to the inputs thereof, a source of signal frequency connected to an input of the first signal stage, means to apply to an input of each of the remaining signal stages the output of a preceding signal stage, means generating a plurality of fixed frequencies arranged in groups, the range of frequencies in successive groups being related by increasing factors of a selected radix to the ranges of frequencies in one of said groups, sources of carrier frequencies, means connected to apply selected ones of said carrier frequencies to the other inputs of each of the first and alternate successive signal stages for producing modulation products at the outputs of these signal stages having frequencies which are respectively within the ranges of the second and successive ones of the groups of fixed frequencies, means connected to apply selected ones of said fixed frequencies from the first and successive groups respectively to the other inputs of each of the second and alternate successive signal stages, another signal stage having an input connected to one of said other inputs of the first and alternate successive signal stages, and means to apply selected ones of said fixed and carrier frequencies to the other input of said other signal stage for producing an output signal as the combination of the frequencies of signals applied to the inputs thereof.

7. A frequency synthesizer comprising a plurality of signal stages each having at least two inputs and an output and being adapted to produce modulation products as combination of the frequencies of signals applied to the inputs thereof, a signal source of variable frequency connected to an input of the first signal stage, means to apply to an input of each of the remaining signal stages the output of a preceding signal stage, means generating a plurality of fixed frequencies arranged in groups, the range of frequencies in successive groups being related by increasing factors of ten to the range of frequencies in one of said groups, sources of carrier frequencies, means connected to apply selected ones of said carrier frequencies to the other inputs of each of the first and alternate successive signal stages for producing modulation products at the outputs of these signal stages having frequencies which are respectively within the ranges of the second and successive ones of the groups of fixed frequencies, means connected to apply selected ones of said fixed frequencies from the first and successive groups respectively to the other inputs of each of the second and alternate successive signal stages, another signal stage having an input connected to one of the outputs of the second and alternate successive signal stages, and means to apply to the other input of said other signal stage selected ones of said fixed frequencies from one of the second and successive ones of said groups, respectively for producing an output signal as the combination of the frequencies of signals applied to the inputs of said other signal stage.

8. A frequency synthesizer as in claim 7 wherein said other signal stage produces an output signal having a frequency related to the difference between the frequencies of signals applied to the inputs thereof.

9. A frequency synthesizer comprising means forming a first group of fixed frequencies, means forming successive groups of fixed frequencies by multiplying by ten each of the fixed frequencies of a preceding group, a plurality of sources of carrier frequencies, a source of signal frequency means connected to said source of signal frequency and to a source of carrier frequency for producing a first resultant signal as the combination of the signals from these sources having a frequency within the range of fixed frequencies in the second one of said groups, means forming a second resultant frequency as the combination of the first resultant frequency and a selected one of the fixed frequencies in the first one of said groups, and means forming a third resultant frequency as the combination of the second resultant frequency and a selected one of said carrier frequencies and fixed frequencies from the second one of said groups.

10. A frequency synthesizer as in claim 9 wherein the third resultant frequency is formed as the combination of the second resultant frequency and a selected one of said carrier frequencies and comprising means forming a fourth resultant frequency as the combination of the third resultant frequency and a selected one of the fixed frequencies in the second one of said groups, and means forming an output signal as the combination of the fourth resultant frequency and a selected one of the fixed frequencies from a third one of said groups.

11. A frequency synthesizer comprising means producing one group of fixed frequencies, each appearing on a separate conductor, means connected to each of the conductors in said one group for converting the frequency of the signal appearing thereon to another frequency related by a selected radix to the frequency of the signal on the conductor in said one group, the converted frequencies forming another group of fixed frequencies, each appearing on a separate conductor, a first source of signal frequency, a second source of signal having a frequency higher than said signal frequency, a mixer connected to said first and second sources for producing a sideband signal as the combination of said signal frequency and said higher frequency and having a frequency within the range of fixed frequencies in the one of said groups comprising the higher order fixed frequencies, means connected to receive said sideband signal and a fixed frequency from the other one of said groups comprising the lower order fixed frequencies for producing a resultant frequency as the combination of said sideband signal and the fixed frequency from said other group, and means connected to receive said resultant frequency and a fixed frequency from said one group comprising the higher order fixed frequencies for producing an output signal as the combination of the two last-mentioned frequencies.

12. A frequency synthesizer comprising: means producing a first group of ten fixed frequencies within a range of values extending not higher than thirty percent of the lowest frequency of said group, each of the fixed frequencies appearing on a separate conductor, means connected to the conductors in the first group for converting the frequencies of signals appearing thereon to fixed frequencies forming a second group, each appearing on a separate conductor and each being related by a selected radix to a fixed frequency in the first group appearing on a corresponding conductor, a source of carrier frequency; a source of signal frequency having a frequency which is lower than the carrier frequency, mixer means combining the carrier frequency and signal frequency signals to produce a resultant signal having a frequency within the range of said second group of fixed frequencies; mixer means combining the resultant signal with a fixed frequency of the first group to produce another resultant signal, and means combining said other resultant signal and a fixed frequency from the second group to produce an output signal.

13. A frequency synthesizer as in claim 12 wherein each of said mixer means includes a filter having a frequency pass band substantially within the range of fixed frequencies of the second group and being adapted to reject frequencies outside said pass band up to substantially tenth order modulation products.

14. A frequency synthesizer as in claim 12 wherein the signal frequency is within the range of fixed frequencies in the first group.

References Cited by the Examiner

UNITED STATES PATENTS

| | | | |
|---|---|---|---|
| 2,973,483 | 2/61 | Stone | 331—38 |

FOREIGN PATENTS

| | | |
|---|---|---|
| 486,448 | 6/38 | Great Britain. |

ROY LAKE, *Primary Examiner.*